(12) United States Patent
Xu et al.

(10) Patent No.: US 6,544,896 B1
(45) Date of Patent: Apr. 8, 2003

(54) METHOD FOR ENHANCING ETCHING OF TISI$_x$

(75) Inventors: Songlin Xu, Fremont, CA (US); Takakazu Kusuki, Kanagawa (JP); Xueyu Qian, Milpitas, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/686,208

(22) Filed: Oct. 10, 2000

Related U.S. Application Data

(63) Continuation of application No. 09/264,381, filed on Mar. 5, 1999.

(51) Int. Cl.[7] .............................................. H01L 21/302
(52) U.S. Cl. ...................... 438/710; 438/711; 438/714; 438/715; 438/719; 438/720
(58) Field of Search .................................. 438/710, 711, 438/714, 715, 719, 720, 721

(56) References Cited

U.S. PATENT DOCUMENTS

| | | | |
|---|---|---|---|
| 4,659,426 A | 4/1987 | Fuller et al. | 156/643 |
| 4,680,086 A | 7/1987 | Thomas et al. | 156/643 |
| 4,778,563 A | 10/1988 | Stone | 156/643 |
| 5,014,217 A | 5/1991 | Savage | 364/498 |
| 5,118,387 A | 6/1992 | Kadomura | 156/643 |
| 5,143,866 A | 9/1992 | Matsutani | 437/187 |
| 5,160,407 A | 11/1992 | Latchford et al. | 156/656 |
| 5,342,476 A | 8/1994 | Cain | 136/643 |
| 5,429,070 A | 7/1995 | Campbell et al. | 118/723 R |
| 5,591,301 A | 1/1997 | Grewal | 156/643.1 |
| 5,605,601 A * | 2/1997 | Kawasaki | 438/695 |
| 5,698,072 A | 12/1997 | Fukuda | 156/653.1 |
| 5,738,756 A | 4/1998 | Liu | 156/627.1 |
| 5,792,710 A * | 8/1998 | Yoshida et al. | 438/721 |
| 5,843,226 A | 12/1998 | Zhao et al. | 117/97 |
| 5,854,137 A | 12/1998 | Kuo | 438/714 |
| 5,958,801 A | 9/1999 | Langley | 438/738 |
| 6,103,631 A * | 8/2000 | Soda et al. | 438/714 |

FOREIGN PATENT DOCUMENTS

EP 0516043 12/1992 ......... H01L/21/321

OTHER PUBLICATIONS

E. Soda et al., "Correlation between Etching Characteristics of Titanium Silicide and its Crystal Structure under Cl$_2$ or HBr Plasma Etching", *Dry Process Symposium* (1997), pp. 33–38.

Q. Xu et al., "Reactive ion etching of TiSi$_2$/n$^+$polysilicon polycide structure for very large scale integrated application", *J. Vac. Sci. Technol.* B, vol. 8, No. 5 (1990), pp. 1058–1061.

PCT Search Report for PCT/US 00/05730, mailed Aug. 22, 2000.

* cited by examiner

*Primary Examiner*—Benjamin L. Utech
*Assistant Examiner*—Binh X Tran
(74) *Attorney, Agent, or Firm*—Shirley L. Church; Joseph Bach

(57) ABSTRACT

Conventional methods of etching TiSi$_x$ use Cl$_2$ or HBr as the plasma etchant. However, these methods can lead to undesirable residues, due to the presence of silicon nodules in the TiSi$_x$. The present invention overcomes the residue problem by adding a fluorine containing gas to the plasma etchant, which is then able to effectively etch the Si nodules at an etch rate which is approximately the same as the etch rate of the TiSi$_x$, so that the undesirable residue is not formed. A method of etching TiSi$_x$ is provided, wherein the surface of the TiSi$_x$ is exposed, typically through a patterned mask, to a plasma etchant. The plasma etchant comprises (i) at least one fluorine containing gas, such as SF$_6$, NF$_3$, C$_x$F$_y$, and compatible mixtures of such gases; and (ii) a gas selected from the group consisting of HBr, Cl$_2$, and combinations thereof.

16 Claims, 5 Drawing Sheets

METHOD FOR ENHANCING ETCHING OF TISI$_x$

This application is a continuation application of application Ser. No. 09/264,381, filed Mar. 5, 1999, which is currently pending

BACKGROUND OF THE INVENTION

1. Field of the Invention

The present invention relates generally to a fabrication process for manufacturing semiconductor devices. More particularly, the present invention relates to a method and etchant useful for etching TiSi$_x$.

2. Background

Titanium silicide (TiSi$_x$) is a material likely to be used with increasing frequency in semiconductor devices. In particular, TiSi$_x$ is a candidate for use as a gate material in memory devices such as DRAMs and SRAMs, because it favorably has a lower resistivity than materials presently used as gate materials in such devices, such as tungsten silicide (WSi$_x$) and polysilicon. This lower resistivity allows faster devices, i.e., devices having a smaller RC delay, to be fabricated. Moreover, it is becoming possible to fabricate memory devices having dimensions smaller than about 0.25 microns. At this small scale, the resistance of the conventional gate electrode composed of polysilicon and tungsten silicide (WSi$_x$) will be high enough to cause significant delay in signal transmission. Substituting TiSi$_x$ for the WSi$_x$ is expected to advantageously mitigate such delay.

Many desirable applications require the ability to anisotropically etch TiSi$_x$. It is known to anisotropically etch TiSi$_x$ using Cl$_2$ or HBr in an inductively coupled plasma (ICP) etcher. See Soda et al., "Correlation between Etching Characteristics of Titanium Silicide and its Crystal Structure under Cl$_2$ or HBr Plasma Etching," *Dry Process Symposium*, 33, 1997, ("Soda") which is hereby incorporated by reference in its entirety. However, it has been observed that such etching may leave a residue due to the presence of Si nodules in the TiSi$_x$. See Soda. This residue is very difficult to remove, and may interfere with device performance. In addition, the Si nodules may act as "micro-masks" that shield underlying TiSi$_x$ from the etching process, which can lead to roughness in the profile of the etched surface. Also, many process conditions may lead to undercutting, due to isotropic etching of the sidewall.

SUMMARY OF THE INVENTION

A method of etching TiSi$_x$ is provided. A patterned mask is provided on top of a layer of TiSi$_x$. The TiSi$_x$ is exposed, through the patterned mask, to a plasma etchant. The plasma etchant comprises (i) at least one fluorine containing gas, such as SF$_6$, NF$_3$, C$_x$F$_y$ (where x ranges from about 1 to about 10), and compatible mixtures of such gases; and (ii) a gas selected from the group consisting of HBr, Cl$_2$, and combinations thereof.

Conventional methods of etching TiSi$_x$ use Cl$_2$ or HBr as the plasma etchant. However, these methods can lead to undesirable residues, due to the presence of silicon nodules in the present TiSi$_x$. While not intending to be limited to any explanation as to why the present invention works, it is believed that the conventional Cl$_2$ or HBr plasma chemistry has a selectivity for TiSi$_x$, relative to Si nodules, significantly greater than 1, ie., the plasma etches TiSi$_x$ at a faster rate than Si nodules that are often present in TiSi$_x$. Since the Si nodules are not etched as quickly as the TiSi$_x$, they act as "micro-masks," by shielding underlying TiSi$_x$ from the etching process. The Si nodules may also act as micro-masks for other layers, such as a layer of polysilicon underlying the TiSi$_x$. Note that the Si nodules are not polysilicon, and are etched at rates significantly different from polysilicon. The difference in the etch rate of the Si nodules and TiSi$_x$ is more pronounced when Cl$_2$ is used as the etchant than when HBr is used. As a result, the residue and micro-masking effect are more severe when Cl$_2$ is used as the etchant. The present invention overcomes the residue problem by adding a fluorine containing gas to the plasma etchant, which is then able to effectively etch the Si nodules so that the undesirable residue is not formed.

DETAILED DESCRIPTION OF THE INVENTION

Conventional HBr and/or Cl$_2$ plasma etchant chemistries for TiSi$_x$, which use a feed gas that includes HBr and/or Cl$_2$, usually produce an etched surface which exhibits undesirable residues. As used herein, the terms "including" and "comprising" are used, inter alia, to describe a plasma source gas mixture of the particular gases included, which source gas may include additional gases as well. These terms are not intended to limit where the gases are mixed, such that a feed gas including two separate gases may be implemented by mixing the gases prior to feeding them into the vacuum chamber, or by feeding them into the vacuum chamber via separate routes.

The present invention improves upon conventional HBr and/or Cl$_2$ plasma etching of TiSi$_x$ by using a plasma source gas that includes a fluorine containing gas as well as HBr and/or Cl$_2$. As used herein, the term "element containing gas" refers to a gas having molecules that contain an atom of the particular element. For example, carbon tetrafluoride (CF$_4$), nitrogen trifluoride (NF$_3$) and sulfur hexafluoride (SF$_6$) are "fluorine containing gases."

While not intending to be limited as to any explanation as to why the present invention works, it is believed that the addition of a fluorine containing gas reduces the difference between the etch rate of the TiSi$_x$ and the etch rate of the Si nodules. In particular, the addition of a fluorine containing gas to a conventional HBr and/or Cl$_2$ plasma feed gas, in the ranges described herein, decreases the selectivity of the resultant plasma etchant for TiSi$_x$ relative to the Si nodules. As a result, undesirable residue and micro-masking effect are reduced or eliminated.

The inventors estimate that a plasma etchant having a selectivity (etch rate ratio) of TiSi$_x$: Si nodules of below about 1.5:1 (preferably below about 1.2:1, and most preferably about 1:1) will reduce residue problems due to the Si nodules.

Preferably, the feed gas does not include any hydrocarbon-containing gases. We believe that such hydrogen containing gases may cause undesirable polymer deposition during the etch process.

Feature Geometry

The present invention may be used in conjunction with any process step that etches $TiSi_x$. Features that may be fabricated include trenches, vias, and lines, by way of example and not by way of limitation.

Figure 1A:
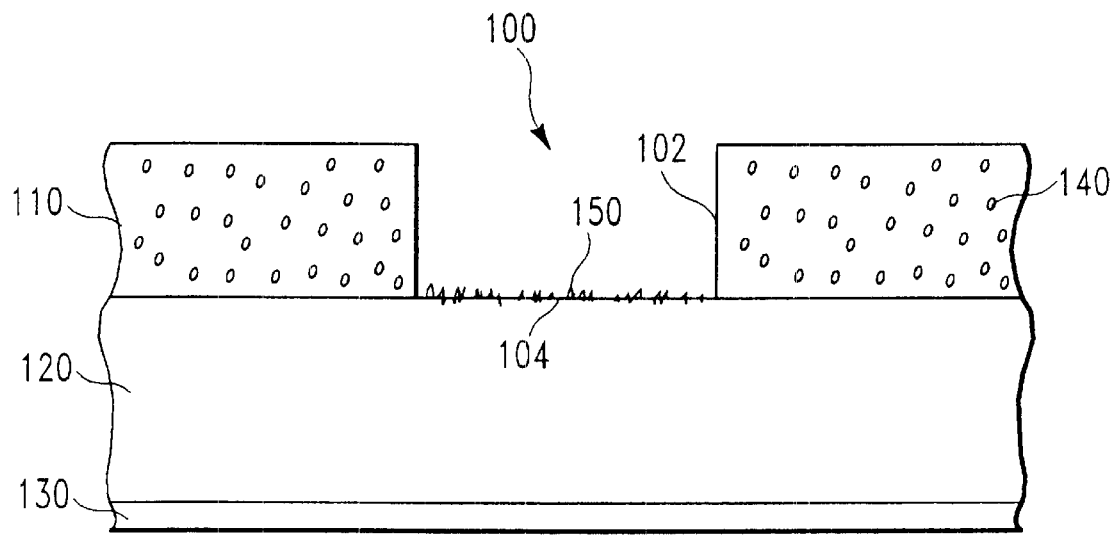
FIGS. 1A and 1B (prior art) each show a schematic of a cross-sectional view of a trench fabricated using conventional methods.
Figure 1B:
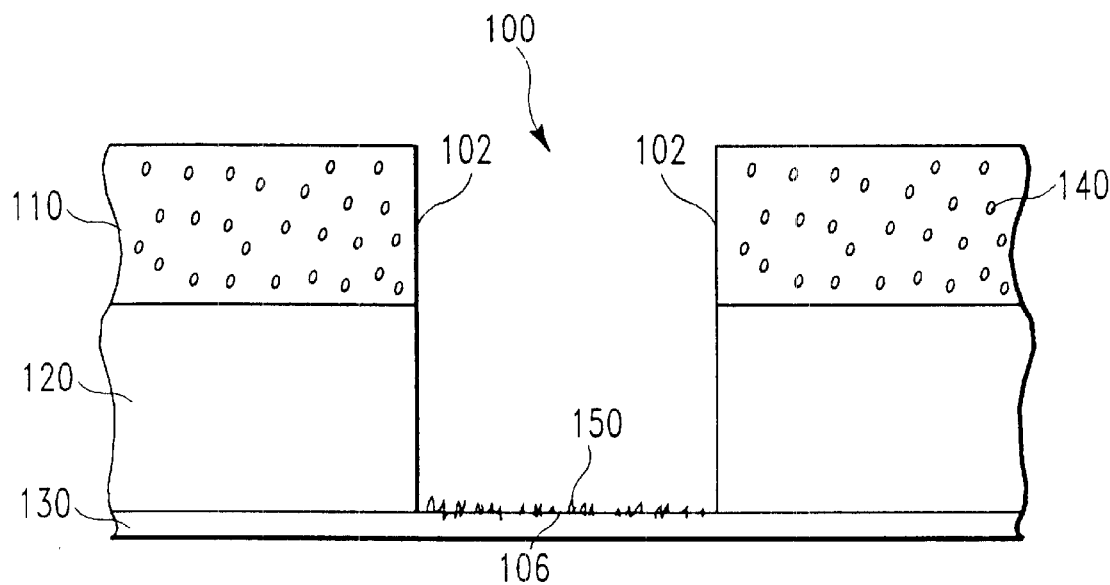

One frequently etched feature is a gate electrode trench. FIGS. 1A (prior art) and 1B (prior art) each show a trench 100 fabricated using conventional methods. Layer 110 of titanium silicide is disposed on top of layer 120 of polysilicon, which is disposed on top of a layer 130 of gate oxide. In FIG. 1A, the trench 100 is etched through (into) a layer 110 of titanium silicide. In FIG. 1B, the trench is extended through a layer 120 of polysilicon. Trench 100 was etched from layer 110 of $TiSi_x$ using conventional plasma etching, i.e., an HBr and/or $Cl_2$ plasma with a substrate bias applied to provide ion bombardment. Trench 100 has side walls 102. In FIG. 1A, trench 100 has a bottom surface 104 which is covered with residue (debris) 150. In FIG. 1B, trench 100 has a bottom surface 106 which is also covered with residue 150. The residue is attributed to the presence of Si nodules 140 in layer 110 of titanium silicide. These Si nodules act as micro-masks during the etching process, and are responsible for residue 150 on bottom surfaces 104 and 106. Even though there are not silicon nodules 140 in layer 120 of polysilicon, residue 150 on bottom surface 104 propagates itself during the etching of layer 120 of polysilicon.

Figure 2A:
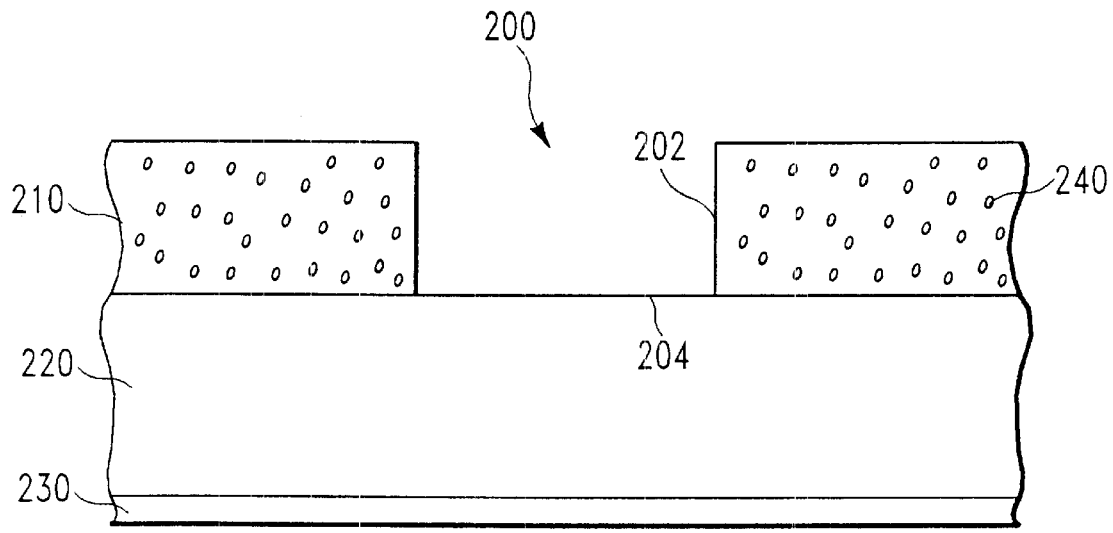
FIGS. 2A and 2B each show a schematic of a cross-sectional view of a trench fabricated in accordance with the present invention.
Figure 2B:
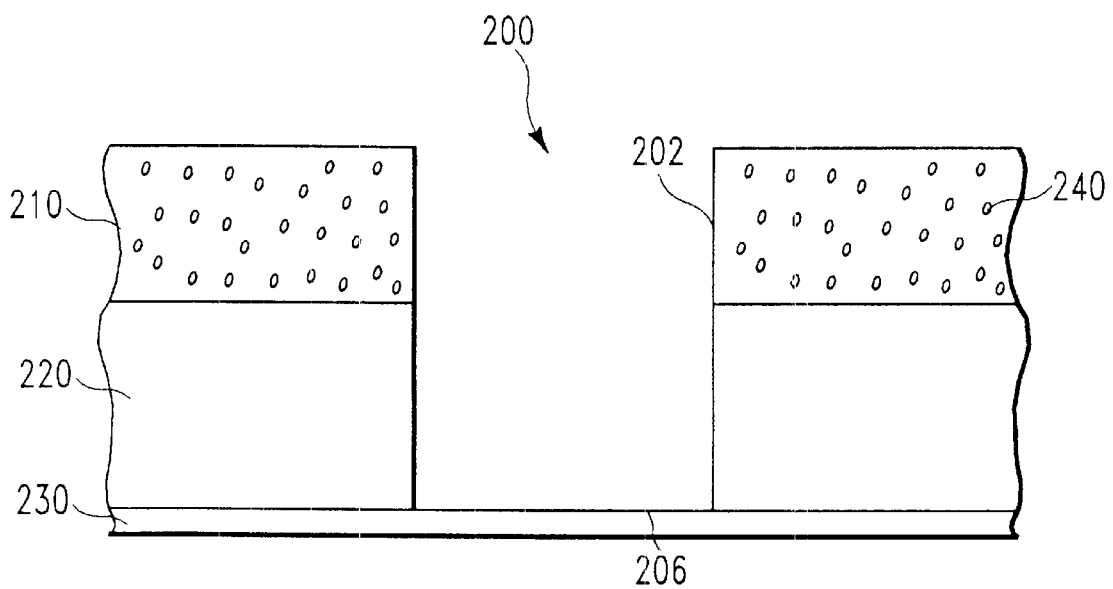

FIGS. 2A and 2B show a trench 200 fabricated in a layer 210 of titanium silicide and extended into a layer 220 of polysilicon, respectively, in accordance with the present invention. Layer 210 of titanium silicide is disposed on top of layer 220 of polysilicon, which is disposed on top of a layer 230 of gate oxide. FIG. 2A shows the trench as partially fabricated through layer 210, but not through layer 220. FIG. 2B shows the trench fully fabricated through both layers 210 and 220. Trench 200 was etched from layer 210 of $TiSi_x$ in accordance with the present invention, i.e., a plasma generated from a plasma source gas that includes a fluorine-containing gas as well as HBr and/or $Cl_2$, with a substrate bias applied to provide ion bombardment. Trench 200 has side walls 202. In FIG. 2A, trench 200 has a bottom surface 204, and in FIG. 2B, trench 200 has a bottom surface 206, and in each instance there is no residue on these bottom surfaces after the trench etching process. Although Si nodules 240 are present in layer 210 of titanium silicide, these Si nodules are removed during the etching process, such that there is little or no residue on bottom surfaces 204 and 206 of FIGS. 2A and 2B, respectively.

Preferred Apparatus

The present invention may be practiced in any apparatus adapted to expose a substrate to a plasma. Preferably, the apparatus has the capability of applying a substrate bias to the substrate. Most preferably, the apparatus has a "decoupled plasma source", which has separate controls for power input to a plasma source generator and for power input to a substrate bias device. The power to the plasma source generator determines the plasma density, while the power to the substrate bias device determines the degree of ion bombardment energy on the substrate surface and enables anisotropic etching. A decoupled plasma source typically incorporates measures to separate (decouple) the influence of the plasma source power and bias power on one another. The CENTURA® DPS™ silicon etching system including a decoupled plasma source, available from Applied Materials, Inc. of Santa Clara, Calif. was used to produce the preferred embodiments of the present invention. However, the present invention may be practiced in an apparatus having a plasma source that is not decoupled, i.e., the plasma source power and the bias power are not separately controllable, or in any other type of apparatus adapted to expose a substrate to a plasma.

Figure 3:
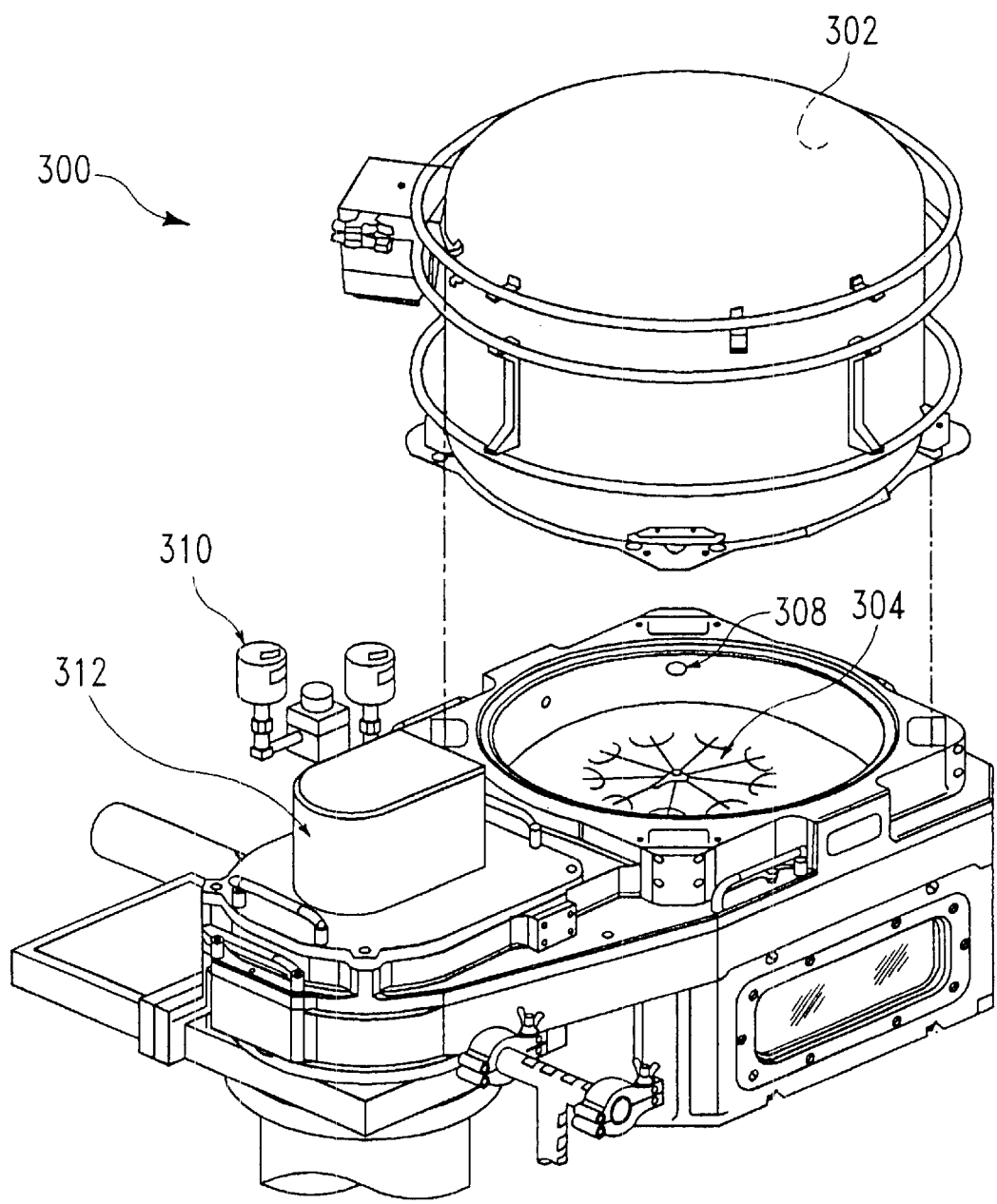
FIG. 3 (prior art) shows a schematic of a three-dimensional view of a silicon etch chamber having a decoupled plasma source.

FIG. 3 (prior art) shows a three-dimensional schematic of a silicon etch chamber 300, including a decoupled plasma source, of the type used in the CENTURA® DPS™ etch system. Chamber 300 includes a ceramic dome 302 and a standard monopolar electrostatic chuck (ESC) 304. Gas is introduced into the chamber via four ceramic gas injection nozzles 308 for uniform gas distribution. Chamber pressure is controlled by a closed-loop pressure control system 310 with a throttle valve 312.

Chamber 300 uses an inductive plasma source, frequency typically tuned at approximately 12.56 MHZ, to generate and sustain a high density plasma (i.e., having an electron density of at least $10^{11} e/cm^3$). The wafer is typically biased with a 13.56 MHZ RF power source. The decoupled nature of the plasma source allows independent control of ion energy and ion density, which provides highly uniform plasma (<5% variation) with a wide process window over changes in source and bias power, pressure, and etch gas chemistry. Note that optimal process parameters, such as plasma source power and bias power, may be highly dependent on a number of factors, such as the frequency of the power source, chamber geometry, etc. When the present invention is practiced in an apparatus different from the preferred apparatus, one of skill in the art can determine the process parameter appropriate for use with the particular apparatus with minimal experimentation.

Figure 4:
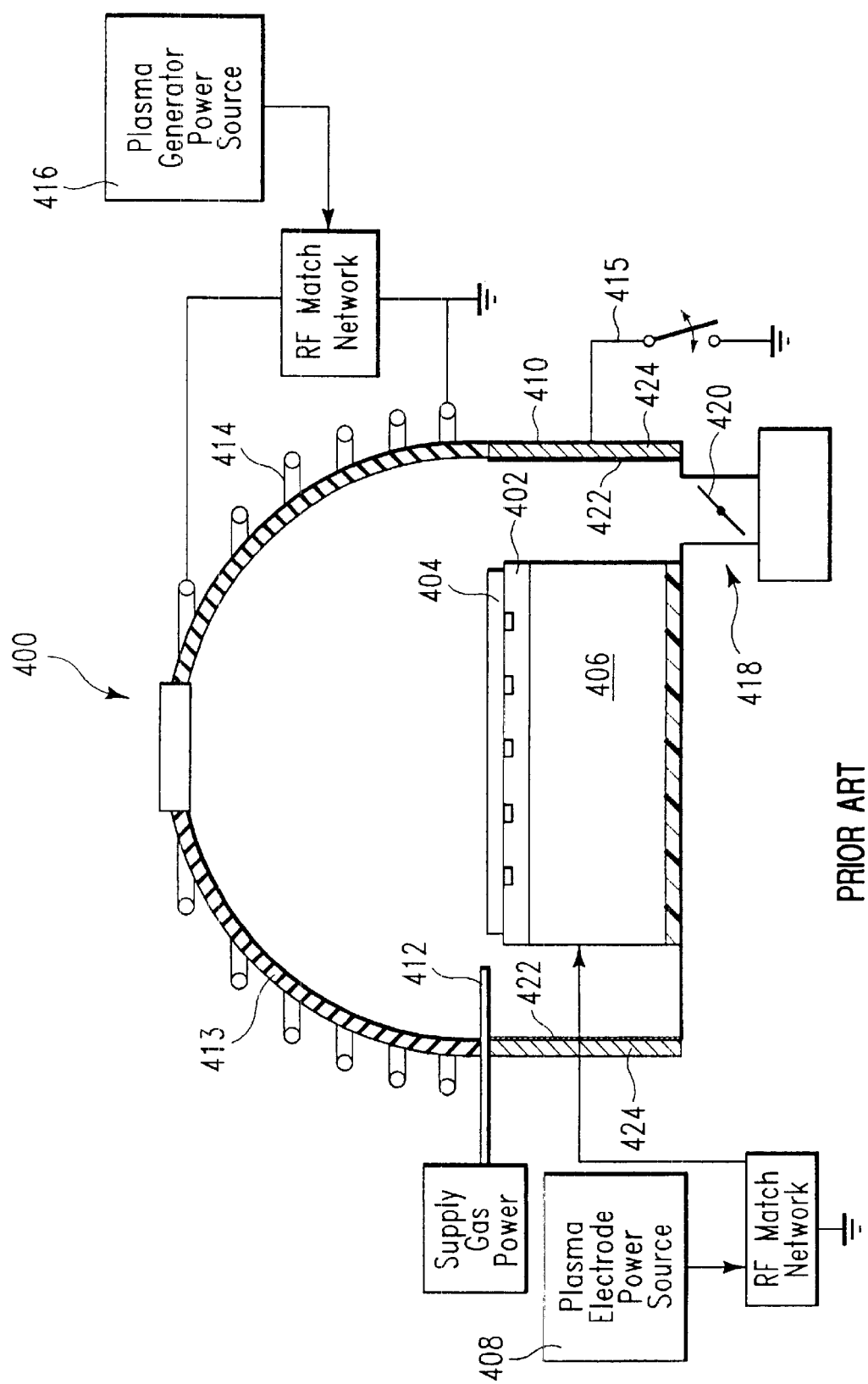
FIG. 4 (prior art) shows a schematic of a cross sectional view of a silicon etch decoupled plasma source chamber of the kind shown in FIG. 3.

FIG. 4 (prior art) shows a schematic of a vertical cross-sectional view of a chamber 400 of the kind shown in FIG. 3. Electrostatic chuck 402 is adapted to hold a substrate 404. Electrostatic chuck 402 overlies a cathode plasma electrode 406, which is electrically connected to an independently controlled plasma electrode (RF) power source 408. The upper portion 413 of the chamber wall comprises ceramic. The lower portion 410 of the chamber wall typically comprises an anodized aluminum surface 422 over an aluminum base body 424 which is electrically grounded at ground 415. A plasma source gas is introduced into and distributed throughout chamber 400 by means of a gas distributor 412 peripherally disposed above substrate 404. Plasma ions are formed from the plasma source gas by applying an RF current to an inductive coil plasma generator 414, which is connected to an independently controlled plasma generator (RF) power source 416. The cathode electrode 406 is electrically biased with respect to the inductor 410 by applying an RF voltage to the cathode electrode 406 via power source 408, so that the plasma ions formed in chamber 400 are attracted toward and energetically impinge upon the substrate 404. Spent process gas and etchant by-products are exhausted from chamber 400 through an exhaust system 418. A throttle valve 420 is provided in exhaust system 418 to control the pressure in the chamber 400.

Figure 5:
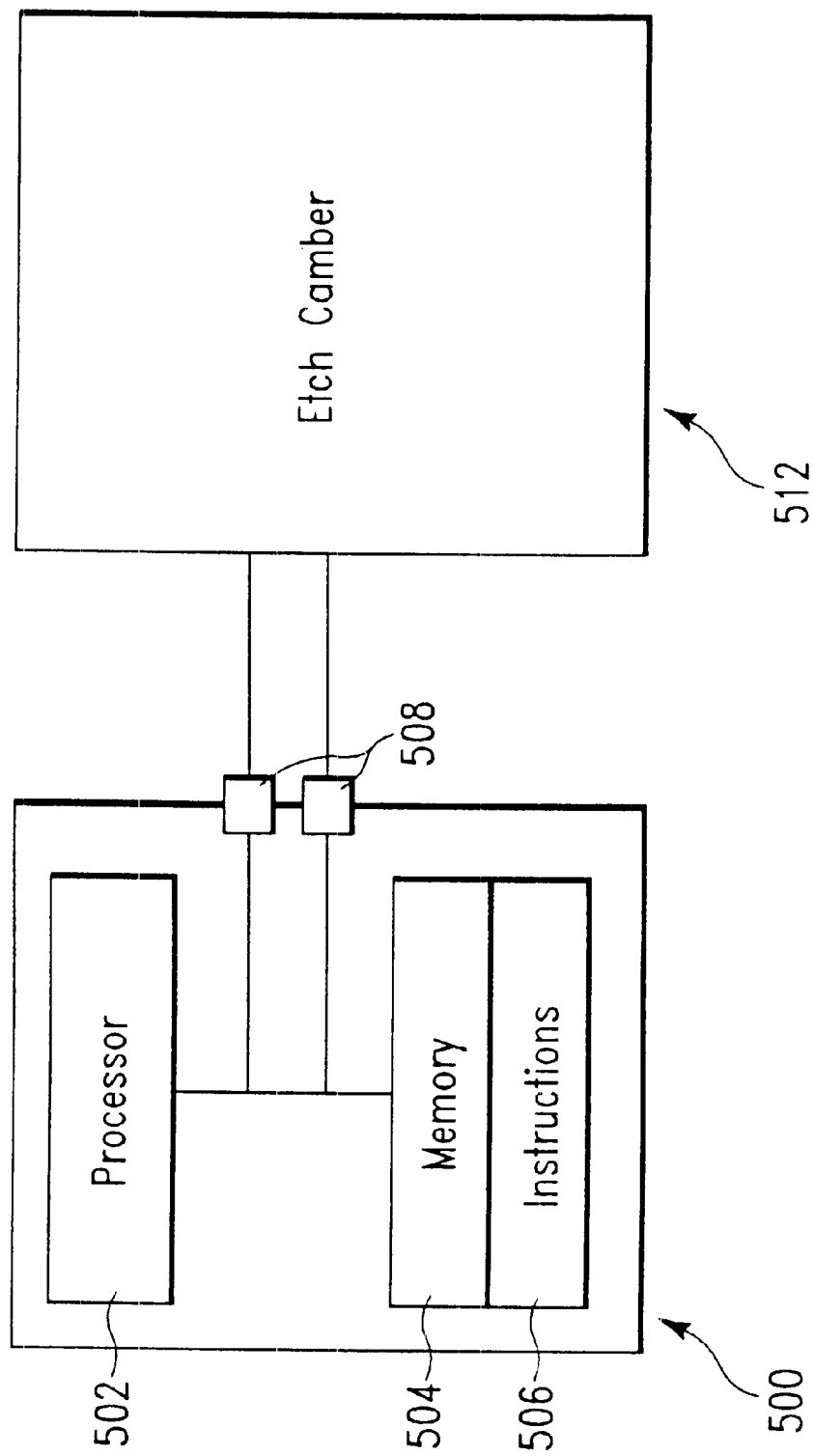
FIG. 5 shows a computer used to control processes being carried out in an etch chamber of the kind shown in FIG. 4.

Preferably, the apparatus used to practice the present invention is adapted to be controlled by a computer. FIG. 5 shows a computer 500 adapted to provide process control for etch chamber 512. Computer 500 comprises a processor 502, memory 504 adapted to store instructions 506, and one or more ports 508. Processor 502 is adapted to communicate with memory 504 and to execute instructions 506. Processor 502 and memory 504 are also adapted to communicate with one or more ports 508. Ports 508 are adapted to communicate with a plasma etch chamber 512. Plasma etch chamber is adapted to carry out process steps in accordance with signals received from processor 502 via ports 508. Preferably, computer 500 can control process variables such as the composition and feed rate of the plasma source gas, the temperature, the pressure in the chamber, the bias power, the plasma source generation power. Preferably, computer 502 is adapted to receive measurements that describe the condition in the chamber, and adapt the process variables accordingly, such as shutting down the etch process when an optical etch end point determination is made.

Anisotropic Etching

For many structures incorporating $TiSi_x$, it is desirable to etch the $TiSi_x$ anisotropically, i.e., the etching proceeds at an appreciable rate in a direction normal to the surface of a wafer, but does not proceed at an appreciable rate in lateral directions. Anisotropy may be caused by the etch process itself, and/or by the crystal structure of the $TiSi_x$. Device fabrication relies primarily on the etch process itself, although crystal structure may affect the direction of etching as well. Depending upon the particular device, some deviation from a perfect anisotropic etch may be tolerable. For example, a trench that is measurably narrower at the bottom than the top, or that has walls that bow outward to some degree, may be acceptable. In addition, while many situations in which the present invention might be used involve anisotropic etching, the present invention is not limited to anisotropic etching.

Plasma etching with ion bombardment is one process used to achieve anisotropic etching. The ion bombardment is directional, normal to the surface of the wafer. Chemically reactive plasma etching is typically used in combination with ion bombardment to enable the etching to proceed at an appreciable rate in the direction of the ion bombardment. Preferably, etching does not occur at an appreciable rate in other directions, even though surfaces such as sidewalls may be exposed to plasma reactive etchants, because there is no ion bombardment in those directions. However, if process conditions and the reactive etchant are not selected properly, etching may occur in lateral directions, even though there is no ion bombardment in the lateral directions.

For etching silicon, as well as most silicides, fluorine containing gases are more aggressive reactive etchants than HBr and $Cl_2$, with $Cl_2$ being a more aggressive etchant than HBr. Any of these etchants may, depending upon the process conditions, etch laterally, into an exposed sidewall although the problem is more pronounced with more aggressive etchants. Process conditions that may affect whether lateral etching occurs include plasma density (plasma source generation power), the temperature of the substrate, substrate surface bias voltage (substrate bias power), process chamber pressure, and plasma composition.

One problem that may arise during an anisotropic etch is tapering, i.e., the area etched decreases as the distance away from the mask increases. Tapering may be caused by the formation of a passivation layer on the sidewalls, and in particular at the juncture between the sidewalls and the base of the etched feature. One cause of such a passivation layer is plasma polymerization due to the presence of carbon in the plasma. This carbon may come from a plasma source gas that contains carbon, such as $CF_4$, or the erosion of a photo resist mask that contains carbon. Plasma polymerization may be decreased or eliminated by the addition of a small amount of oxygen to the plasma source gas. For example, where $CF_4$ is a component of the plasma source gas, oxygen is preferably added in an amount such that the ratio of oxygen to $CF_4$ is about 1:5 by volume. Using too little oxygen may result in plasma polymerization. Using too much oxygen undesirably decreases the amount of the primary etchant gases, and may also result in passivation of the $TiSi_x$ surface by an oxidation mechanism, resulting in a decrease in etch rate.

EXAMPLES

Using a CENTURA® DPS™ etching system, the inventors have found that anisotropic etching of $TiSi_x$ without formation of appreciable residue may be achieved using a plasma source gas comprising a mixture of HBr and $SF_6$, wherein the amount of $SF_6$ is less than about 20% by volume of the feed gas; or using a plasma source gas mixture of HBr and $CF_4$, wherein the amount of $CF_4$ is less than about 40% by volume of the feed gas. Preferably, the amount of $SF_6$ and/or $CF_4$ is greater than about 5% by volume of the plasma source gas. Amounts of $SF_6$ or $CF_4$ in excess of 20% by volume or 40% by volume, respectively, attacked the trench side walls, such that the etching was not anisotropic. Using too little $SF_6$ or $CF_4$ results in an undesirable residue. Our analysis shows that similar amounts of other fluorine containing gases will also be effective in reducing or eliminating residue. These other fluorine containing gases include inorganic gases, such as $NF_3$, as well as organic gases, such as $C_xF_y$, where x ranges from about 1 to 10. The appropriate range for the amount of inorganic fluorine containing gases should be similar to that for $SF_6$. The appropriate range for the amount of organic fluorine containing gases should be similar to that for $CF_4$.

We believe that the presence of fluorine in the plasma not only provides isotropic etching, but also cleans the residue from the wafer surface, and reduces and/or removes deposition on the walls of the vacuum chamber. The use of fluorine may therefore favorably increase the number of wafers which may be processed prior to cleaning the process chamber.

The substrate temperature typically is about 40° C.–80° C., and more preferably about 40° C.–50° C. By-products of the etching process may not be sufficiently volatile at to sustain a desirable etch rate at significantly lower temperatures. A temperature too far above these ranges may result in etching that is not anisotropic. Note that the temperature "measured" by the CENTURA® DPS™ etching system and reported herein is about 30° C.–40° C. lower than the actual substrate temperature, due to the placement of the thermocouple used to measure temperature. Note that substrate temperature is difficult to estimate, and there may be an inaccuracy of ±10° C. or more. If a different system is used, the difference between "measured" temperature and substrate temperature may be different, but can be indexed off the substrate temperature.

The bias power is typically about 100–180 W. When the plasma source gas includes $Cl_2$ (as opposed to HBr), the upper end of the bias power range is preferably used to maintain anisotropic etching. Bias power that is too far below this range may result in undesirably slow etch rates, profile undercutting, and/or undesirable residue. Bias powers that are too far above these ranges may result in an unacceptable amount of mask erosion and/or a tapered etch profile. Suitable bias powers may vary depending upon the system used.

The gas feed rate was 100 sccm, and the pressure inside the vacuum chamber was maintained at 3 mTorr. The plasma source generator power was 300 W. These parameters may be varied in a manner apparent to one of skill in the art. Suitable values may vary depending upon the system used.

Whether anisotropic etching is achieved depends upon whether a particular combination of the various processing parameters can achieve a suitably fast etching rate in a direction normal to the substrate without attacking the side walls. Accordingly, the process parameters provided above are only preferred guidelines, and it may be possible to achieve anisotropic etching with one or more parameters falling outside of the ranges provided, depending upon the particular combination of parameters.

Several samples were fabricated by sputtering a $TiSi_x$ film onto a layer of poly silicon above a thin gate oxide, followed by a high temperature anneal, using techniques known to the art. Masks having apertures in the shape of parallel lines with a width of about 0.25 microns, with 0.25 microns of mask separating the apertures, were provided above the $TiSi_x$, using techniques known to the art. Both photo resist and hard masks were used in each example.

Example 1
Etch with $Cl_2$

Samples were fabricated as described above. The samples were etched in a CENTURA® DPS™ etching system using $Cl_2$ plasma. The measured temperature was 50° C., i.e., the substrate temperature was about 80° C., $Cl_2$ gas was fed into the chamber at a rate of 100 sccm, the pressure in the chamber was maintained at 3 mTorr, the plasma source generation power was 300 W, and the bias power was 100 W.

Trenches were obtained having an appearance similar to that of FIG. 1B. Significant residue was present on the bottom of the trenches. In addition, the sidewalls were undercut, due to the Cl specie attacking the side walls during the etch. The undercutting was less pronounced in the samples using photo resist masks, probably due to the formation of a protective passivation layer on the side walls as a by-product of resist erosion.

It may be possible to reduce the isotropic etching of the side wall by Cl specie by adding a passivation gas such as $O_2$ and/or $N_2$. However, the amount of these gases must be carefully controlled to avoid the creation of significant difference between the etch rates of $TiSi_x$ and polysilicon (which may increase the formation of undesirable residue).

Example 2
Etch with HBr

Samples were fabricated as described above, and etched in a CENTURA® DPS™ etching system using HBr plasma. All process parameters were the same as Example 1, except that HBr was used instead of $Cl_2$.

Trenches were obtained having an appearance similar to that of FIG. 1B. Significant residue was present on the bottom of the trenches. The amount of residue was less than in Example 1, probably because the difference in the etch rates between $TiSi_x$ and poly silicon is less in the HBr process than in the $Cl_2$ process. The sidewalls were not significantly bowed outward, in contrast to Example 1. This superior profile control, i.e., no bowing, probably occurs because HBr is a less aggressive etchant than $Cl_2$.

Example 3
Low Temperature Etch with $Cl_2$

Samples were fabricated as described above. The samples were etched in a CENTURA® DPS™ etching system using a $Cl_2$-based plasma. The process parameters were the same as Example 1, except that the measured temperature was 5° C., i.e., the substrate temperature was about 40° C., with several different bias powers used on several different samples. Bias powers of 100 W, and 150 W led to etch rates of about 2250 Å/min and 2500 Å, respectively.

Trenches were obtained having an appearance similar to those of Example 1. Significant residue was present on the bottom of the trenches. The bowing of the sidewalls was less pronounced than in Example 1.

Example 4
Low Temperature Etch with HBr

Samples were fabricated as described above. The samples were etched in a CENTURA® DPS™ etching system using an HBr-based plasma. The process parameters were the same as Example 2, except that the measured temperature was 5° C., and several different bias powers were used on several different samples. Bias powers of 100, 150, and 180 W led to etch rates of about 1000 Å/min, 1250 Å/min, and 1400 Å/min, respectively. The bias power of 180 W, higher than those used for $Cl_2$, was used to increase the lower etch rates achieved with the less aggressive HBr etchant.

In both examples 3 and 4, less residue was observed at higher bias powers, probably because the higher bias power may decrease the difference in the etch rates of $TiSi_x$ and poly silicon, and due to increased ion bombardment of the etch surface. However, very high bias power (greater than about 200 W for the equipment used in this example) may cause undesirable mask erosion, which may lead to undesirable profile micro loading. One skilled in the art can determine, with minimal experimentation, the optimum bias power for a particular piece of equipment.

In example 4, trenches were obtained having an appearance similar to those of Example 2. Significant residue was present on the bottom of the trenches; however, the amount of residue was less than in Example 3.

The ability to achieve reasonable etch rates at a measured temperature of 5° C. (substrate temperatures of about 40° C.) is an unexpected result. In particular, etch rates of the conventional material $WSi_x$ decrease rapidly as temperature decreases, preventing the use of low temperature etching, i.e., etching at substrate temperatures below about 50° C. One of skill in the art would expect a similar phenomena to occur with $TiSi_x$. However, the etch byproducts for $TiSi_x$ turned out to be particularly volatile, making it possible to etch $TiSi_x$ at lower temperatures than expected.

Example 5
Low Temperature Etch

Samples were fabricated as described above. The samples were etched in a CENTURA® DPS™ etching system using either HBr or $Cl_2$ plasma. The process parameters were the same as Examples 3 and 4, except that the measured temperature was 10° C., i.e., the substrate temperature was about 40° C., and the bias power was 100 W.

Results similar to those observed for Examples 3 and 4 were obtained.

Example 6
HBr and $SF_6$ Etchant

Samples were fabricated as described above. The samples were etched in a CENTURA® DPS™ etching system using an $HBr/SF_6$ plasma where the plasma source gas flow rate was 100 SCCM and the volumetric percentages were 85% HBr and 15% $SF_6$. The measured temperature was 5° C., the pressure in the chamber was maintained at 3 mTorr, the plasma source generation power was 300 W. Samples were etched using bias powers of 100 W and 200 W.

Trenches were obtained having an appearance similar to that of FIG. 2B. Significant residue was not observed on the bottom of the trenches. The side walls were not significantly undercut. Example 6 shows how an etchant comprising HBr and $SF_6$ can be used to effectively reduce or eliminate residue formation during the etching of $TiSi_x$. This residue reduction was achieved at a relatively lower bias power of 100 W, reducing the likelihood that profile micro loading might be a problem. The residue reduction was also achieved without significant isotropic etching of the side walls.

It is believed that inorganic fluorine containing gases may be substituted for $SF_6$ to achieve similar results. One example of such a gas is $NF_3$. The amount of fluorine containing gas used should be such that the volumetric percentage of the fluorine containing gas in the plasma source gas is within the same range recommended for $SF_6$.

Example 7
HBr and $CF_4$ Etchant

Samples were fabricated as described above. The samples were etched in a CENTURA® DPS™ etching system using an HBr/$CF_4$ plasma. The measured temperature was 5° C., the pressure in the chamber was maintained at 3 mTorr, the plasma source generation power was 300 W, and the bias power was 100 W. A gas comprising 90% by volume HBr AND 10% by volume $CF_4$ was fed into the chamber at a total rate of 100 sccm.

Results similar to those for Example 6 were observed. However, the side walls were tapered, i.e., the bottom surface of the trench was narrower than the mouth of the trench. This tapering is caused by plasma polymerization due at least in part to the carbon-containing free radicals generated from the $CF_4$. The inventors believe that the efficiency of residue removal can be improved and sidewall plasma polymerization reduced by adding $O_2$ into the plasma. It is believed that the $O_2$ would reduce carbon concentration in the plasma. It is further believed that the $O_2$:$CF_4$ ratio should be about 1:5 or less.

One skilled in the art may substitute other organic fluorine containing gases for $CF_4$ to achieve similar results, wherein the chemical formula is $C_xF_Y$ and x ranges from 1 to about 10. The amount of fluorine containing gas used should be such that the amount of $C_xF_Y$ is about 5%–40% of the total plasma source gas.

Example 8
Integration with Other Process Steps

The samples produced in Examples 7 and 8 were further processed using conventional methods. In particular, the $TiSi_x$ was etched using the process described in Examples 7 and 8 to the interface between the $TiSi_x$ and the underlying polysilicon. The polysilicon was then etched using a conventional $Cl_2$/HBr/$O_2$ chemistry to the interface between the polysilicon and the underlying gate oxide. The samples were then exposed to a conventional HBr/$O_2$ overetch to clean any remaining polysilicon. This further processing appears to be easily integrated into the present invention $TiSi_x$ etch method.

Example 9
HBR AND $CF_4$ Etchant

Samples were fabricated as described above. The samples were etched in a CENTURA® DPS™ etching system using an HBr/$CF_4$ plasma. The process parameters were the same as for Example 7, except the bias power was 150 W, and the plasma source gas comprised 80% by volume HBr and 20% by volume $CF_4$.

Results similar to those for Example 7 were observed.

While the foregoing is directed to preferred embodiments of the invention, other and further embodiments of the invention may be devised without departing from the basic scope thereof. The scope of the invention is determined by the claims that follow.

What is claimed is:

1. A method of etching a layer of $TiSi_x$, while reducing a micro masking effect caused by silicon nodules present in said layer of $TiSi_x$, by exposing said layer of $TiSi_x$ to a plasma generated from a plasma source gas containing less than about 20% by volume of an inorganic fluorine-containing compound, wherein said inorganic fluorine-containing compound consists essentially of $NF_3$, and wherein the temperature of a surface of said $TiSi_x$ layer during etching is within the range of about 40° C. to about 80° C.

2. A method of etching a layer of $TiSi_x$, while reducing a micro masking effect caused by silicon nodules present in said layer of $TiSi_x$, by exposing said layer of $TiSi_x$ to a plasma etchant generated from a plasma source gas comprising less than about 20% by volume of an inorganic fluorine-containing compound, wherein said inorganic fluorine-containing compound consists essentially of $NF_3$, and a gas selected from the group consisting of HBr, $Cl_2$, and combinations thereof, and wherein the temperature of a surface of said $TiSi_x$ layer during etching is within the range of about 40° C. to about 80° C.

3. The method of claim 1 or claim 2, wherein said etching is carried out with a bias applied to said layer of $TiSi_x$, whereby said etching is substantially anisotropic.

4. The method of claim 3, wherein said plasma source gas further comprises $O_2$.

5. The method of claim 2, wherein said gas selected from the group consisting of HBr, $Cl_2$, and combinations thereof makes up between about 60% to about 95% by volume of said plasma source gas.

6. The method of claim 2, wherein said gas selected from the group consisting of HBr, $Cl_2$ and combinations thereof consists essentially of HBr.

7. The method of claim 2, wherein said gas selected from the group consisting of HBr, $Cl_2$ and combinations thereof consists essentially of $Cl_2$.

8. The method of claim 2, wherein a bias power is applied to said $TiSi_x$ layer to increase ion bombardment.

9. The method of claim 1 or claim 2, wherein said temperature of said surface of said $TiSi_x$ layer during etching is within a range of about 40° C. to about 50° C.

10. The method of claim 1 or claim 2, wherein said plasma source gas does not include any hydrogen-containing gases.

11. The method of claim 1 or claim 2, wherein a selectivity of $TiSi_x$: Si nodules is less than about 1.5:1.

12. The method of claim 11, wherein a selectivity of $TiSi_x$: Si nodules is less than about 1.2:1.

13. The method of claim 12, wherein a selectivity of $TiSi_x$: Si nodules is about 1.0:1.

14. A method of etching a layer of $TiSi_x$, while reducing a micro masking effect caused by silicon nodules present in said layer of $TiSi_x$, by exposing said layer of $TiSi_x$ to a plasma generated from a plasma source gas containing less than about 40% by volume of an organic fluorine-containing compound, or less than about 20% by volume of an inorganic fluorine-containing compound, wherein the temperature of a surface of said $TiSi_x$ layer during etching is within the range of about 40° C. to about 80° C., and wherein a selectivity of $TiSi_x$: Si nodules is less than about 1.2:1.

15. A method of etching a layer of $TiSi_x$, while reducing a micro masking effect caused by silicon nodules present in said layer of $TiSi_x$, by exposing said layer of $TiSi_x$ to a plasma etchant generated from a plasma source gas comprising less than about 40% by volume of an organic fluorine-containing compound, or less than about 20% by volume of an inorganic fluorine-containing compound, and a gas selected from the group consisting of HBr, $Cl_2$, and combinations thereof, wherein the temperature of a surface of said $TiSi_x$ layer during etching is within the range of about 40° C. to about 80° C., and wherein a selectivity of $TiSi_x$: Si nodules is less than about 1.2:1.

16. The method of claim 14 or claim 15 wherein a selectivity of $TiSi_x$: Si nodules is about 1.0:1.

* * * * *